(12) United States Patent
Van Zyl et al.

(10) Patent No.: US 8,344,559 B2
(45) Date of Patent: Jan. 1, 2013

(54) MULTI-FEED RF DISTRIBUTION SYSTEMS AND METHODS

(75) Inventors: Gideon Van Zyl, Fort Collins, CO (US); Juan Jose Gonzales, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 362 days.

(21) Appl. No.: 12/435,526

(22) Filed: May 5, 2009

(65) Prior Publication Data
US 2010/0283395 A1    Nov. 11, 2010

(51) Int. Cl.
*H02J 9/00* (2006.01)
(52) U.S. Cl. ........................................ 307/157
(58) Field of Classification Search .................... 307/157
See application file for complete search history.

(56) References Cited

U.S. PATENT DOCUMENTS

| | | | |
|---|---|---|---|
| 5,556,549 A | 9/1996 | Patrick et al. | |
| 7,554,334 B2 * | 6/2009 | Shannon et al. | 324/535 |
| 8,040,068 B2 * | 10/2011 | Coumou et al. | 315/111.21 |
| 2010/0194195 A1 | 8/2010 | Coumou et al. | |

FOREIGN PATENT DOCUMENTS
WO    2009039521 A1    3/2009

OTHER PUBLICATIONS

Baharlou, Simin, "International Preliminary Report on Patentability re Application No. PCT/US2010/033071", Dec. 17, 2011, Published in: PCT.

Mitrovic, Bayer, "International Search Report and Written Opinion re Application No. PCT/US2010/033071", Mar. 15, 2011, Published in: PCT.

* cited by examiner

*Primary Examiner* — Hal Kaplan
(74) *Attorney, Agent, or Firm* — Neugeboren O'Dowd PC

(57) ABSTRACT

Improved power distribution architectures for the uniform delivery of single frequency RF power to plasma chambers are disclosed. The architectures include feeding into multiple points across a single large-area electrode, multiple electrodes driving a common plasma discharge as well as multiple coils driving a common plasma discharge. The time-averaged electromagnetic field distribution may be controlled using an array of generator and match (delivery) systems, one of which may be capable of absorbing net power and presenting controlled impedance to the plasma load. In variations, an M+N port network (with M the number of generators and N the number of feed points on the electrode) may be implemented to level the power required from each generator while maintaining a desired field strength distribution.

15 Claims, 17 Drawing Sheets

MULTI-FEED RF DISTRIBUTION SYSTEMS AND METHODS

BACKGROUND OF THE INVENTION

1. Field of Invention

This invention relates to plasma processing systems, and more specifically, to improved methods and systems for multi-feed RF power distribution in plasma processing systems.

2. Description of Related Art

Plasma enhanced chemical vapor deposition systems are used to fabricate silicon thin films such as amorphous silicon (a-Si), microcrystalline silicon (μc-Si), silicon oxide ($SiO_2$), and silicon nitride ($Si_3N_4$) for thin film transistors (TFTs) and solar cell, i.e., photovoltaic, applications. Generally, a substrate is supported in a vapor deposition process chamber and is heated to several hundred degrees Celsius. The substrate may be made of glass, quartz, or a polymer. The substrate size can be, for example, 650 by 830 millimeters, although the trend is toward even larger sizes. Deposition gases are injected into the chamber, and excited into a plasma state by a RF (alternating current) frequency between two or more electrodes driven by a power system. A plasma enhanced chemical vapor deposition reaction occurs to deposit a thin film layer onto the substrate. The deposited thin film layer may be a dielectric layer, such as silicon nitride or silicon oxide, or a semiconductor layer, such as amorphous silicon.

Large area deposition is essential to achieve high fabrication throughput, however, maintaining uniform film thickness and characteristics across the substrate becomes increasingly difficult with larger deposition areas. This is due to the formation of standing waves as the wavelength of the excitation frequency approaches the physical dimensions of the electrode.

A number of solutions focusing on the electrode configuration have been proposed for improving deposition uniformity in large plasma chambers relative to the wavelength of the applied RF in the chamber. However, these solutions are generally not capable of delivering a uniform electromagnetic field at a given time. Only the time-averaged value of the magnitude (and/or the magnitude raised to some exponential power) of the electromagnetic field can be made relatively constant over the dimensions of the chamber through some form of modulation of the field (e.g., by phase modulation or mechanical movement).

SUMMARY OF THE INVENTION

In an embodiment of the invention, a method of powering an electrode system driving a plasma chamber comprises: coupling M power generators to N feed points on an electrode system, absorbing power at K of the N feed points, where K<N, and delivering power at the other N−K feed points. The method may further include controlling an impedance presented to the K feed points and controlling the phase and amplitude of delivered power at the other N−K feed points. The M power generators may be coupled to the N feed points on an electrode system via an M+N port network such that the total power delivered to the N feed points is equal to the total power taken from the M generators except for losses in the M+N port network. The power delivered by each of the M generators can be equal. The M+N port network may comprise at least one hybrid combiner and the hybrid combiner may comprise a directional coupler. The directional coupler may comprise a lumped element coupler. The method may further include measuring the impedance presented to the K feed points and adjusting variable elements in the M+N port network to adjust the measured impedance to a desired value. At least one of the power generators may be capable of absorbing power at least equal to the power delivery capability of the generator, but this is certainly not required. The generator may comprise a hybrid combiner with a high power dump resistor. The generator may alternatively comprise a circulator with a high power dump resistor. The method may further include converting the power absorbed at one of the K feed points into power useable by one of the N−K feed points. The M power generators may generate power selected from the group of RF power and VHF power.

In another embodiment of the invention, a power distribution system comprises: a number, M, of generators connected to a number, N, of feed points on an electrode system, the generators comprising a first generator capable of absorbing power from a point on an electrode, and a first impedance matching network coupled to the first generator, the first impedance matching network presenting a controlled impedance to the point on the electrode when the first generator is absorbing power from the point on the electrode. The M generators may comprise a second generator, and further comprising a second impedance matching network coupled to the second generator, the second impedance matching network presenting a controlled impedance to the second generator when the second generator is delivering power to another point on the electrode. The electrode may comprise a plurality of electrodes. The first impedance matching network may be coupled to all of the M generators and comprises N ports capable of coupling the first impedance matching network to N points on the electrode. M may not be equal to N. The first impedance matching network delivers power to a first subset of the N points on the electrode and absorbs power from a second subset of the N points on the electrode. The power distribution system may comprise a common bus for recovering power absorbed at one generator and delivering a portion of that absorbed power to another generator.

In another embodiment of the invention, a power distribution system comprises: a number, M, of generators, and an M+N port network coupled to all of the M generators, and comprising N ports capable of coupling the M+N port network to N points on one or more electrodes, the M+N port network being capable of absorbing power from at least one of the N points on the one or more electrodes. All of the M generators may deliver positive net power to the M+N port network. Particularly, each of the M generators may deliver the same amount of positive net power to the M+N port network. The M+N port network may present a controlled impedance to one of the N points on the one or more electrodes when the M+N network is absorbing power from that point. The M+N port network transfers absorbed power from one of the N points to another one of the N points delivering power to the one or more electrodes.

In another embodiment of the invention, a power distribution system comprises: a common driver amplifier, a first amplitude and phase adjustment circuit, a first power amplifier, and a first impedance matching network coupled to the first power amplifier or the first amplitude and phase adjustment circuit, and a feed point on an electrode, the first power amplifier or the first impedance matching network being capable of absorbing power from the feed point on the electrode. The system may further comprise: a power divider, a second amplitude and phase adjustment circuit, a second power amplifier, and a second impedance matching network coupled to the second power amplifier or the second amplitude and phase adjustment circuit, and a second feed point on an electrode.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Figure 1:
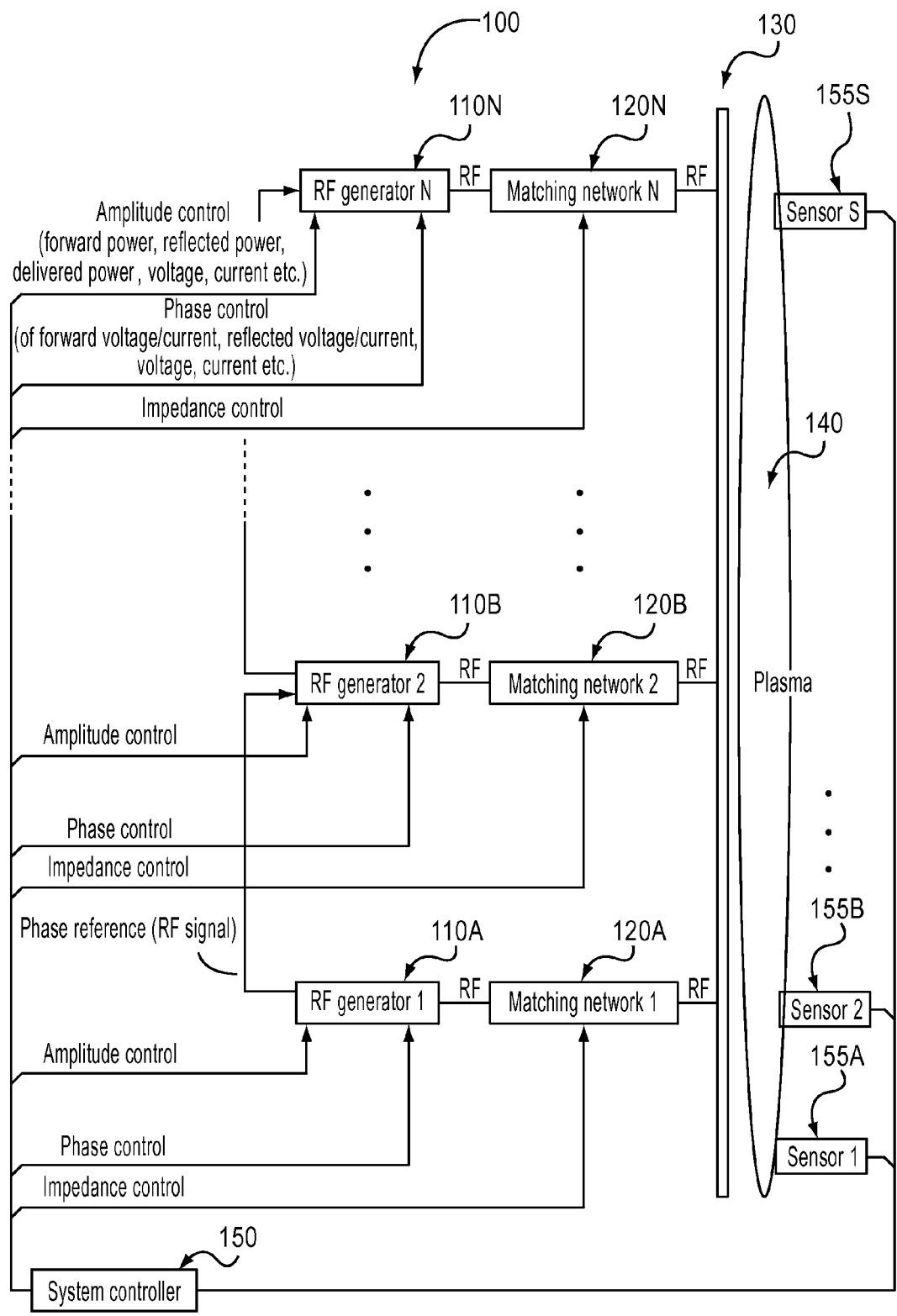
FIG. 1 illustrates a multi-feed RF distribution system driving a single electrode according to an embodiment of the invention.

Embodiments of the present invention and their advantages may be understood by referring to FIGS. 1-18, wherein like reference numerals refer to like elements. As described further herein, several embodiments of the present invention effectively enable precise deposition of thin film layers using an array of power generator and impedance match (delivery) systems in a variety of architectures. The architectures include, for example, multiple feed points across a single large-area electrode, multiple electrodes driving a common plasma discharge, and multiple coils driving a common plasma discharge. And in some embodiments, in addition to multiple feed points, one or more of the geometry of the chamber, the geometry of the electrode, and the gas distribution may be varied to arrive at desired deposition of thin films. In addition, the embodiments and methodologies disclosed herein may be utilized in connection with lens-shaped electrodes such as described in Schmidt, H.; Sansonnens, L.; Howling, A. A.; Hollenstein, Ch.; Elyaakoubi, M.; Schmitt, J. P. M. "Improving plasma uniformity using lens-shaped electrodes in a large area very high frequency reactor." *Journal of Applied Physics*, Volume 95, Issue 9, pp. 4559-4564 (2004), which is incorporated herein by reference.

As described further herein, several embodiments of the present invention effectively control the field distribution using an array of generator and match (delivery) systems, and these generator and match systems are able to absorb net power at some feed points on the electrode system and present a controlled impedance to those feed points while delivering power with a controlled amplitude and phase at other feed points.

One embodiment for example, uses a new type of power delivery system in which the source impedance is well controlled and able to absorb more power than the power delivery capability of the generator. In addition, a new type of impedance matching system may be used, which not only controls the impedance presented to the generator, but also controls the impedance presented to the load. The reabsorbed power can be a substantial fraction of the power delivered to the electrode system, and in some implementations the absorbed power is converted back to usable power (by e.g. the generators delivering net power), which can substantially reduce the input power requirements.

And in some embodiments, an M+N port network is disposed between N feed points on the electrode system to absorb power at K of the N feed points with a controlled impedance and deliver power with a controlled phase and amplitude at the other N−K feed points such that the M (where even M=1 is allowed) generators connected to the network all deliver net power, and the delivered power by each generator can be equalized so that generators with substantially the same power delivery capability can be used. By controlling the phase and power (equivalently forward power, reflected power, voltage and/or current) at each feed point, good uniformity of the electromagnetic field, and hence, film formation (e.g., PECVD film formation) can be achieved without creating undue demands on the generators and/or loads connected to the feed points. The M+N port network may comprise reactive and/or resistive components to isolate the generators, improve plasma stability and impedance matching. The use of such a network may also aid in achieving a desired field distribution and/or make the achieved distribution less sensitive to changes in the plasma, control inputs, environment and component variations.

Although power absorption is not a traditional capability of generators, it is possible to design a generator with the ability to absorb power in a controlled way, e.g., emulating a given load impedance, and transfer the power back on the power line (or dissipate the absorbed power) thus giving additional flexibility for the control of the field distribution. In an embodiment of the invention, the generator-load units can be run on a common DC bus to make it easier to return absorbed power by units operating as loads.

Another way to enable the absorption of power at certain feed points is to use an L+M+N port network that connects L loads and M generators to N feed points. Of course, if the loads are traditional resistive elements, power can only be dissipated. Otherwise, the loads can be replaced by units that can convert the absorbed power back to useful DC or AC power.

As long as enough feed points are provided the technique of absorbing power at some of the feed points is used as disclosed here, it is generally not necessary to resort to time averaging to obtain an even spatial electromagnetic field distribution. However, it is possible to combine time-averaging with the technique of absorbing power at certain feed points to obtain a more optimal solution. In this context more optimal may mean having to use less feed points on the electrode or less generators or being able to use a simpler feed network than would be possible without also using time averaging. As an example, R different field distributions may be combined such that the spatial variation of $$\int_0^T |E_z(t)|^{n_p}\, dt$$

is minimized, where T is the time for the process to complete, $|E_z|$ is the electric field normal to the film deposition substrate (or some other measure of the electromagnetic field) and $n_p$, $p \in 1, 2, \ldots, m$ are different powers that are important for the control of the process (e.g., $n_1=1$ would consider the magnitude of the electric field whereas $n_2=1.5$ may as an example be proportional to plasma density in a certain application). Provided the spatial distributions of the fields from the R different field distributions are designed correctly such a goal may be achieved by running the first field distribution for a time $t_1$, the second for a time $t_2$, etc. In doing so, both the plasma process and the stress on the power generation and delivery system can be managed at the same time.

A delivery system such as the one described may be further enhanced by closed loop control. For example, it may be possible to have sensors that measure light emissions, electric field strength, electron temperature etc. And responsive to the sensed parameters, an input(s) to control the generators may be modulated, and/or the time spent in each configuration corresponding to a field distribution or variable components in the L+M+N network may be controlled to achieve a desired outcome. In addition, within each time slot the amplitude and phase of each generator output may be perturbed and the effect of each generator amplitude and phase on each sensor determined. From this information a sensitivity matrix may be derived, which makes it possible to calculate (either explicitly or through optimization) adjustments to the generator amplitudes and phases to optimize a performance characteristic. For example, the measure of performance may include the effect on the field distribution as estimated by the sensors as well as the effect on the generators and matching networks in terms of, for example, power sharing, isolation, impedance matching and stability.

To cut down on input power requirements, rather than dissipate the reabsorbed power, the generator may convert power back to DC or AC power. In general, by manipulating the voltage source of a Thévenin equivalent source, the implementation of which is apparent to one of ordinary skill in the art, the source can present any impedance at its terminals and if the current into the voltage source has a phase between −90° and 90° with respect to the voltage, power is absorbed by the voltage source. If the voltage source is implemented using approximately lossless switches (e.g., a half-bridge configuration) and an approximately, purely reactive Thévenin equivalent source impedance, the absorbed power (minus any losses) is converted back to the bus or rail as usable power.

The dump resistors in generators employing quadrature combining or circulators are generally capable of dissipating a fraction of the output power capability of the generator—a capability to dissipate about 20% of the output power capability of the generator being typical. To enable the generators to effectively work in an array to produce a uniform electromagnetic field in a chamber using the techniques suggested herein, in some implementations, dump resistors are implemented that are capable of dissipating an amount of power at least equal to, but in general at least 1.5 times the output power capability of the generator according to an embodiment of the invention. These type of dump resistors are referred to as being "oversized."

As discussed further herein, in some embodiments, an M+N port network is implemented that connects M generators to N feed points on the electrode system in such a way that each generator only delivers positive net power. For example, it is possible to design a 1+N port network that uses a single generator to deliver and absorb power at N feed points on an electrode system; on the other hand it is also possible to design an N+N port network using N generators to deliver and absorb power at N feed points on an electrode system where each generator delivers substantially the same amount of power. In general, networks of the type disclosed here may be designed that use M generators to deliver and absorb power at N feedpoints on the electrode system. As more generators are used, more control over the spatial electromagnetic field distribution is obtained through control of the generator output amplitude and phase.

In alternative embodiments, M generators apply power to N feed points and power is not absorbed at the N feed points. For example, situations where the performance is acceptable without absorbing power at some of the feed points include instances where the losses in the plasma load are sufficient to suppress standing waves.

FIG. 1 illustrates a multi-feed RF distribution system 100 driving a single electrode according to an embodiment of the invention. The RF distribution system 100 comprises N RF generators 110A-N and N impedance matching networks 120A-N driving a single electrode 130, a plasma chamber 140, and a system controller 150. The electrode 130 may be electromagnetically coupled to the plasma chamber 140. Alternatively, the electrode 130 may be capacitively and/or inductively coupled to the plasma chamber 140. The generators in this embodiment 110A-N both deliver and absorb power. Each impedance matching network 120A-N presents a controlled impedance to its respective generator 110A-N when it is delivering power and a controlled impedance to the drive point on the electrode 130 when the generator 110A-N is absorbing power.

Phase reference may be provided by one of the generators as shown, e.g., RF generator 110A, or it may be provided by an external reference oscillator (not shown). The system controller 150 is provided to control the amplitude (including forward power, reflected power, delivered power, voltage, current, etc.) and phase (of forward voltage/current, reflected voltage current, voltage, current, etc.) of the RF generators 110A-N, and to control the impedance of the matching networks 120A-N. Sensors 155A-S such as, but not limited to light emission measurement sensors, electrical field sensors, or plasma parameter sensors may be optionally coupled to the system controller 150 to enable closed loop control, the implementation of which is apparent to one of ordinary skill in the art.

In an embodiment of the invention, some generators 110 may need to only absorb power under all plasma conditions and those generators may be replaced by loads. The corresponding matching networks 120 only need to present controlled impedance to the drive point on the electrode 130. Additionally, some generators 110 may always deliver power under all plasma conditions and those generators never have to absorb power. The corresponding matching networks 120 need to only deliver controlled impedance to those generators 110. The balance of the generators 110 and matching networks 120 need to be able to deliver and absorb power and the matching networks 120 present a controlled impedance to the generator 110 when it is delivering power and controlled impedance to the drive point on the electrode 130 when the generator is absorbing power.

Figure 2:
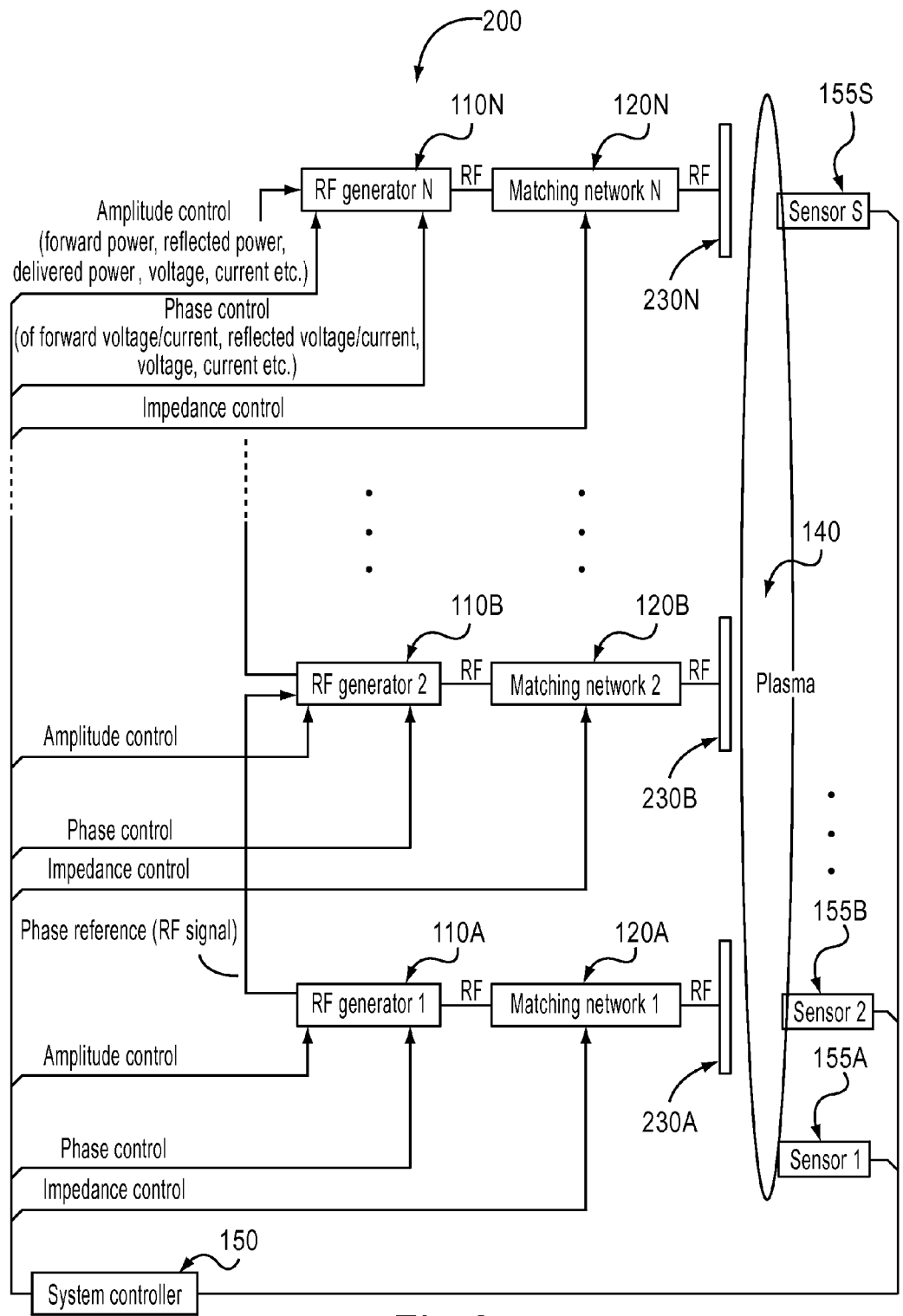
FIG. 2 illustrates a multi-feed RF distribution system driving multiple electrodes according to another embodiment of the invention.

FIG. 2 illustrates a multi-feed RF distribution system 200 driving multiple electrodes according to another embodiment of the invention. Similar to FIG. 1, the RF distribution system 200 comprises N RF generators 110A-N and N impedance matching networks 120A-N, a plasma chamber 140, and a system controller 150. However, instead of driving a single electrode, the distribution system 200 drives multiple electrodes 230A-N, which may be electromagnetically coupled to the plasma chamber 140. Alternatively, the electrodes 230A-N may be capacitively and/or inductively coupled to the plasma chamber 140. Each impedance matching network 120 presents controlled impedance to its respective generator 110 when it is delivering power and a controlled impedance to the respective electrode 230 when the generator 110 is absorbing power.

Figure 3:
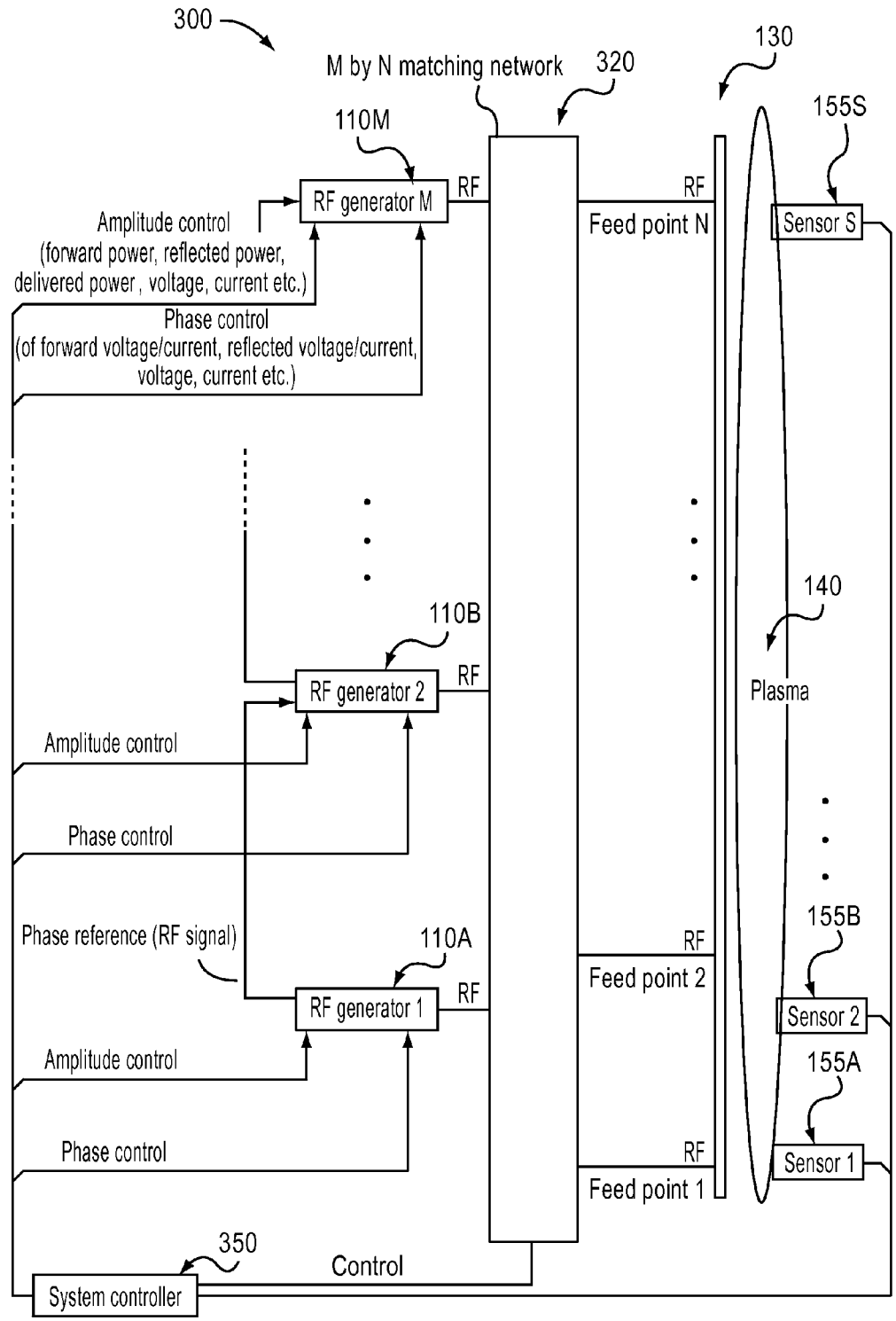
FIG. 3 illustrates a multi-feed RF distribution system of M generators driving a single electrode at N feed points according to an embodiment of the invention.

FIG. 3 illustrates a multi-feed RF distribution system 300 of M generators driving a single electrode at N feed points according to an embodiment of the invention. Here, the RF distribution system 300 comprises M RF generators 110A-M, an M+N port impedance matching network 320, an electrode 130, a plasma chamber 140, and a system controller 350. The M+N impedance matching network 320 permits all generators 110A-M to deliver approximately equal amounts of power to achieve a good electromagnetic field distribution in the plasma 140. To account for different plasma conditions, the amplitude and phase of the generator outputs may be adjusted and under some conditions a particular generator 110 may have to absorb power.

The M+N port impedance matching network 320 delivers the right amount of power with the right phase to certain drive points on the electrode 130 while absorbing power and presenting the required impedance to other feed points on the electrode 130. Adjustable components or switches in the matching network 320 allows for adjustments to both the delivered and absorbed power in the network. The matching network 320 can contain both reactive (dynamic) components including but not limited to capacitors, inductors and coupled inductors (mutual inductance), and resistive components of both a lumped (small dimensions compared to a wavelength) and distributed nature (dimensions large compared to a wavelength) such as transmission line and coupled transmission line elements. The use of resistive elements, even if they nominally dissipate no power can improve isolation between generators 110, decrease sensitivity of the network and enhance plasma stability. The network 320 may be further designed to allow a particular generator 110 to predominantly affect the plasma 140 in a particular area, or the controller 350 can use knowledge of the system 300 to adjust the power and phase of all generators 110 in a coordinated way to adjust the electromagnetic field in a particular area of the plasma 140. The sensors 155A-N may be used to maintain a good electromagnetic field distribution using feedback, or to gather information to allow open loop adjustments of the system to achieve a desired outcome.

Figure 4:
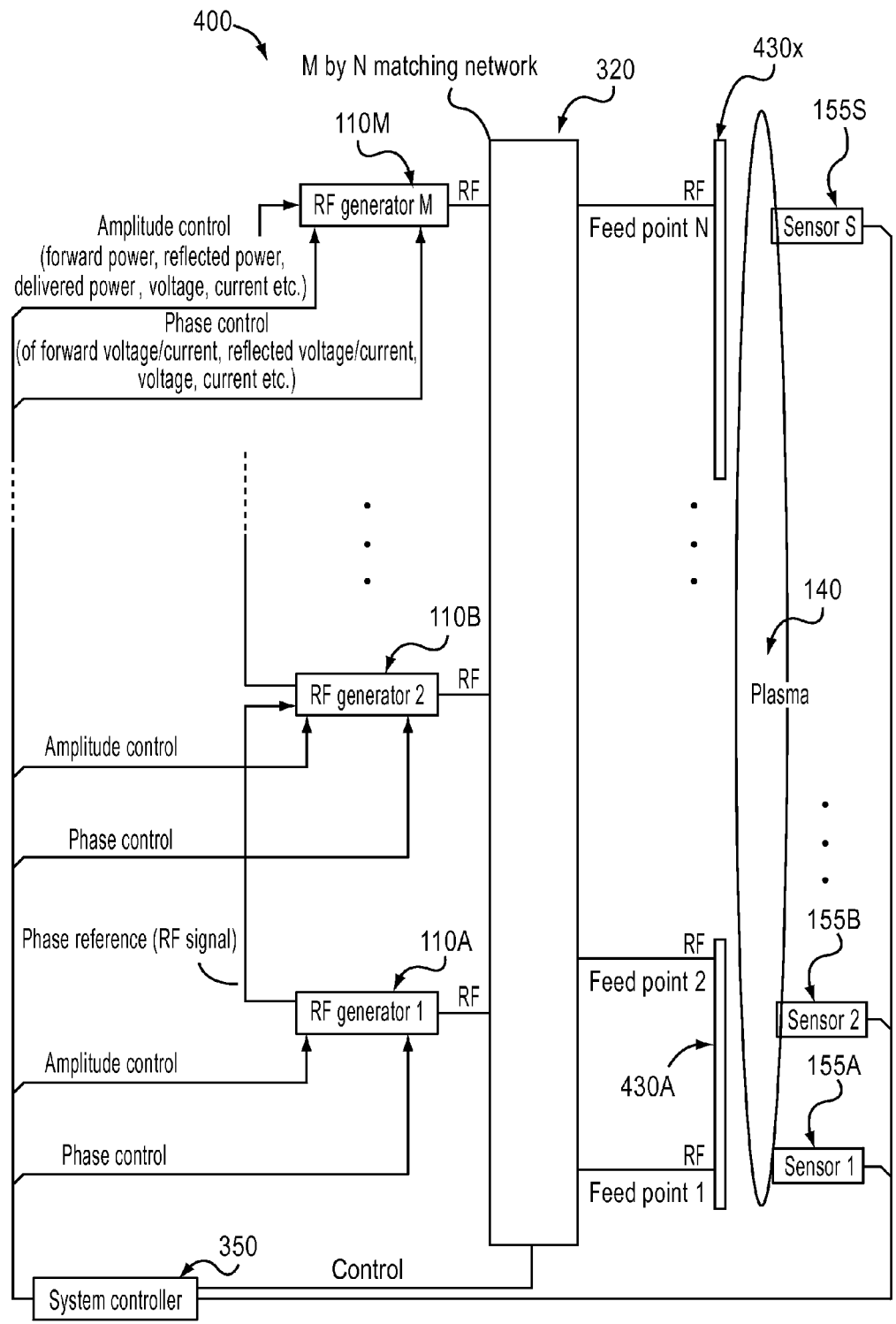
FIG. 4 illustrates a multi-feed RF distribution system of M generators driving a set of electrodes at N feed points according to an embodiment of the invention.

FIG. 4 illustrates a multi-feed RF distribution system 400 of M generators driving a set of electrodes at N feed points according to an embodiment of the invention. Here, the RF distribution system 400 comprises M RF generators 110A-M, an M+N port impedance matching network 320, X number of electrodes 430A-X, a plasma chamber 140, and a system controller 350. Each electrode 430 may contain a variable number of drive points. For example, electrode 430A is driven at two feed points, whereas electrode 430X is driven at one feed point. The electrodes 430X may be electromagnetically coupled to the plasma 140, or alternatively capacitively or inductively coupled to the plasma 140, or using a combination of capacitive and inductive coupling.

Figure 5:
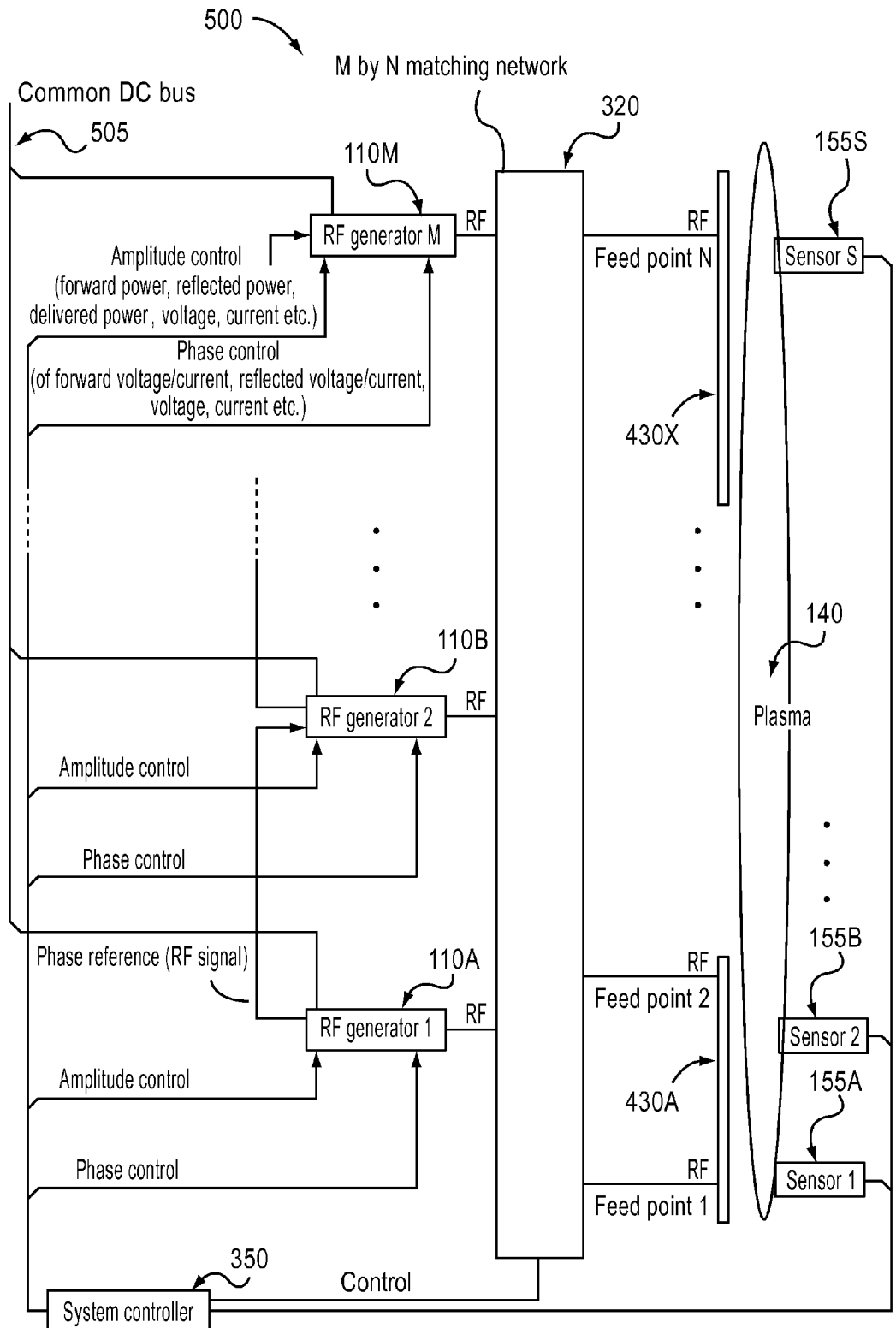
FIG. 5 illustrates a multi-feed RF distribution system with the addition of a common DC bus according to an embodiment of the invention.

FIG. 5 illustrates a multi-feed RF distribution system 500 (similar to that shown in FIG. 4) with the addition of a common DC bus according to an embodiment of the invention. The common DC bus 505 recovers absorbed RF power at certain generators 110 and returns that absorbed power to the bus as usable energy. Note that the common DC bus 505 can be used in any of the configurations shown in the other figures.

Figure 6:
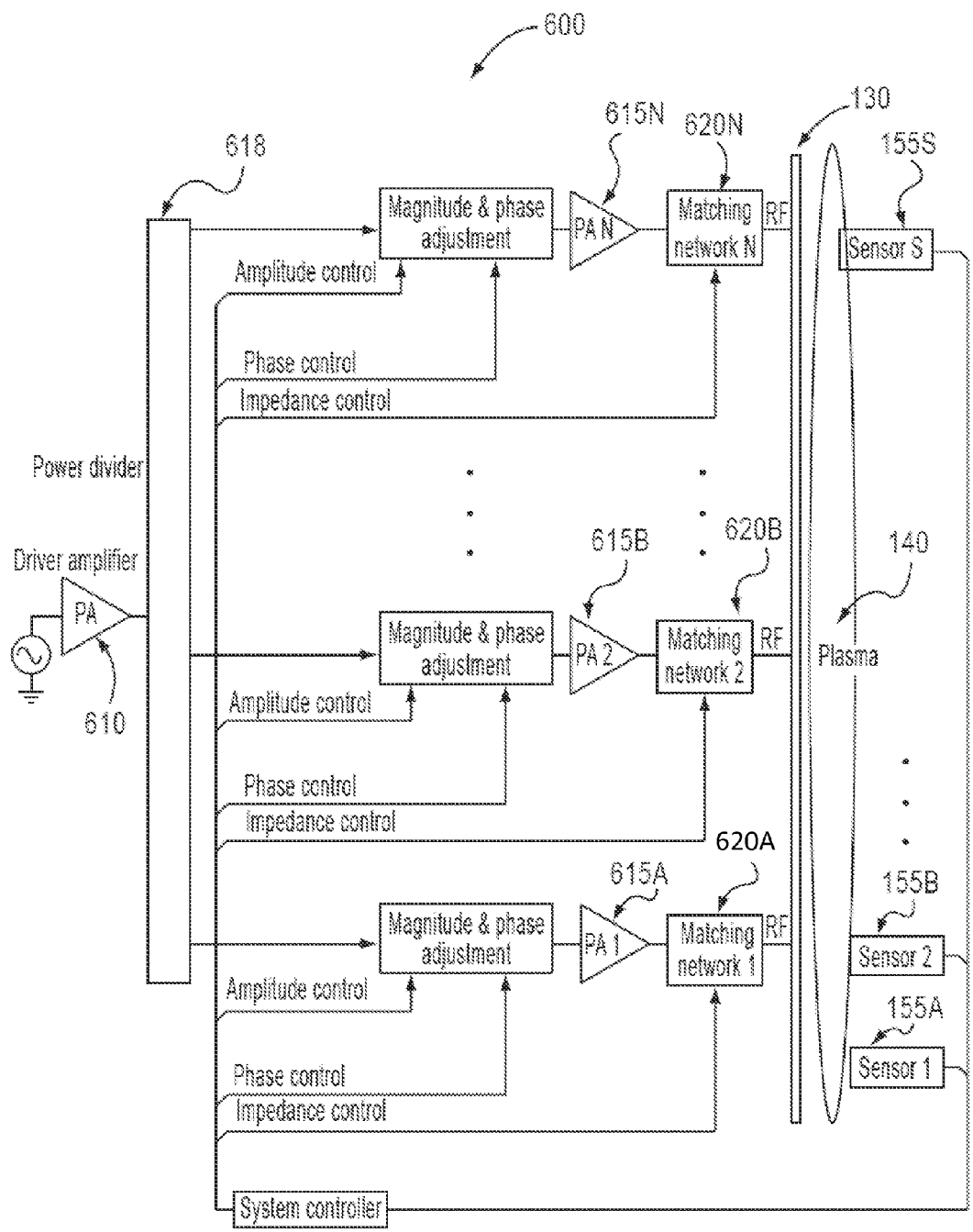
FIG. 6 illustrates a multi-feed RF distribution system driving a single electrode according to an embodiment of the invention.

FIG. 6 illustrates a multi-feed RF distribution system 600 driving a single electrode 130 according to an embodiment of the invention. Here, the system 600 comprises a common driver amplifier 610, which feeds N power amplifiers 615A-N through a power divider 618. The power amplifiers 615A-N drive the electrode 130 through N impedance matching networks 620A-N. Magnitude and phase adjustment circuits adjust the outputs of the individual power amplifiers 615. These magnitude and phase circuits can also be placed after the power amplifiers 615A-N or alternatively in the matching networks 620A-N, but it is generally easier to adjust amplitude and phase before the power amplifiers 615 as shown. Any of the other impedance matching configurations discussed herein such as a M+N network feeding multiple electrodes can also be used in connection with the architecture depicted in FIG. 6. In general, the power amplifiers 615A-N are able to absorb power unless the M+N network is designed in such a way that no power needs to be absorbed by any power amplifier for all the required plasma conditions.

Simulation Results

To illustrate the advantages of the novel power distribution and delivery approaches disclosed herein, the spatial distribution of the time-averaged magnitude and magnitude squared of the electric field component perpendicular to a large area electrode were measured in a simulated electrode and plasma chamber system. Optimization, the implementation of which is apparent, in light of this disclosure, to one of ordinary skill in the art, was employed to determine the voltages required at each feed point that results in the flattest possible spatial distribution of the electromagnetic field. The flattest field distribution (up to a scalar multiplier) dictates the voltages (or equivalently currents, incident and reflected signals) required at each of the feed points. This optimum set of voltages dictates the currents (the electrode system from this perspective is simply a linear N-port network) in turn determining the power needed to be supplied or absorbed at each feed point. These plasma chamber simulations show that the novel power distribution systems disclosed herein are able to reduce the electric field variation from about 12% (if it were simply driven in the middle of the electrode) to 1.25% (if power is delivered at some feed points and absorbed at others in an optimal way according to some embodiments of the invention) in the particular configuration for which the simulation results are presented.

In the following simulations, a large area plate electrode was powered through nine (9) feed points equally spaced apart according to an exemplary embodiment of the invention. One of ordinary skill in the art readily appreciates that various other configurations and numbers of feed points on the electrode can be implemented to achieve similar results. Note that since the simulations assume a linear system, the desired time-averaged electric field magnitude was simply set to one resulting in very small power values. In an actual system the electric field is typically a thousand times higher and the maximum generator power is typically a few kW.

Figure 7:
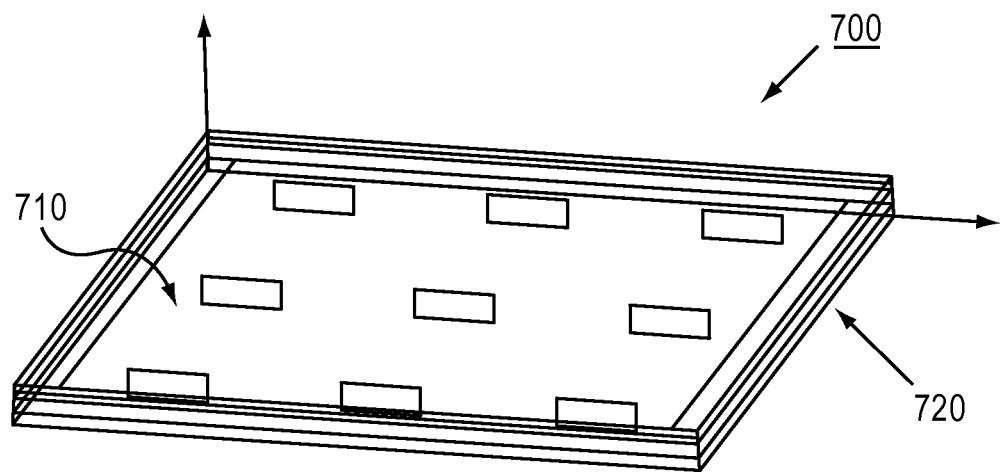
FIG. 7 illustrates a simulated electrode and plasma chamber system according to an embodiment of the invention.
Figure 8:
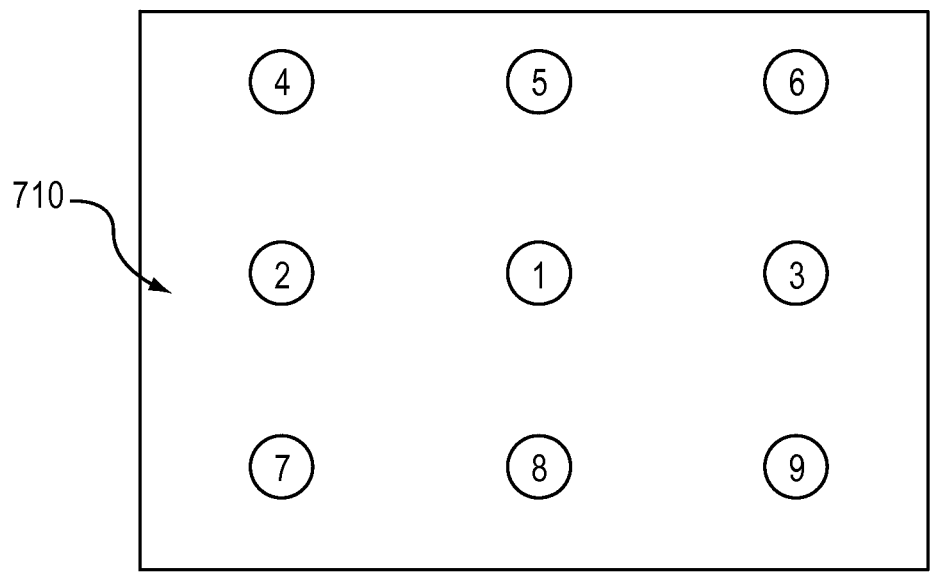
FIG. 8 illustrates the nine (9) exemplary feed points disposed on the electrode of FIG. 1 as viewed from above.

FIG. 7 illustrates a simulated electrode and plasma chamber system 700 according to an embodiment of the invention. The simulated electrode and plasma chamber system 700 comprises a solid electrode 710 and a chamber 720. The electrode 710 measured 1.16 m by 1.16 m and was positioned 25 mm from the sides of the chamber 720—one of ordinary skill in the art readily appreciates that these dimensions are merely exemplary. The 25 mm space was filled by a dielectric with a dielectric constant of 2.0 (thereby simulating an actual plasma load). The back of the electrode 710 was held at vacuum. The electrode 710 was driven at nine (9) feed points (i.e., port numbers 1-9) over its surface as shown in FIG. 8. at a frequency of 60 MHz.

Figure 9:
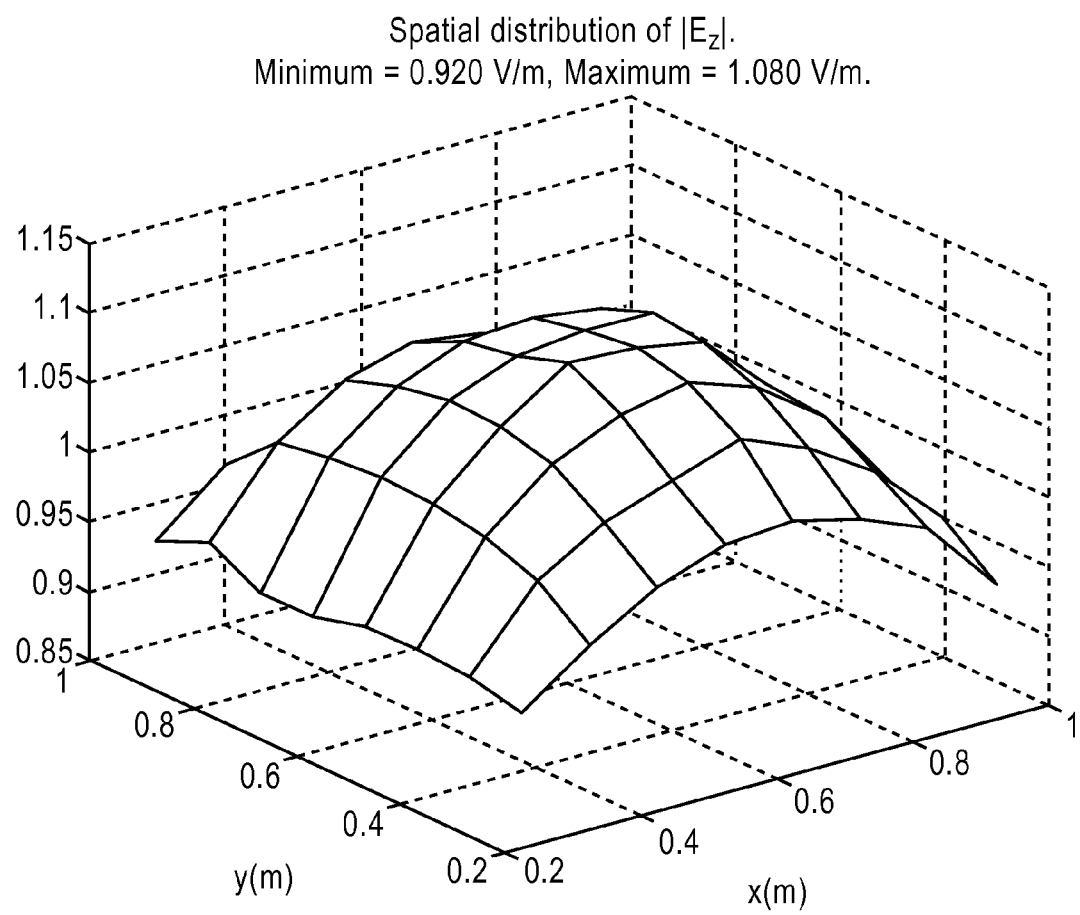
FIGS. 9 and 10 illustrate the best spatial distribution of the magnitude and magnitude squared, respectively, of the electric field component perpendicular to the electrode produced by generators that are only capable of delivering positive net power.
Figure 10:
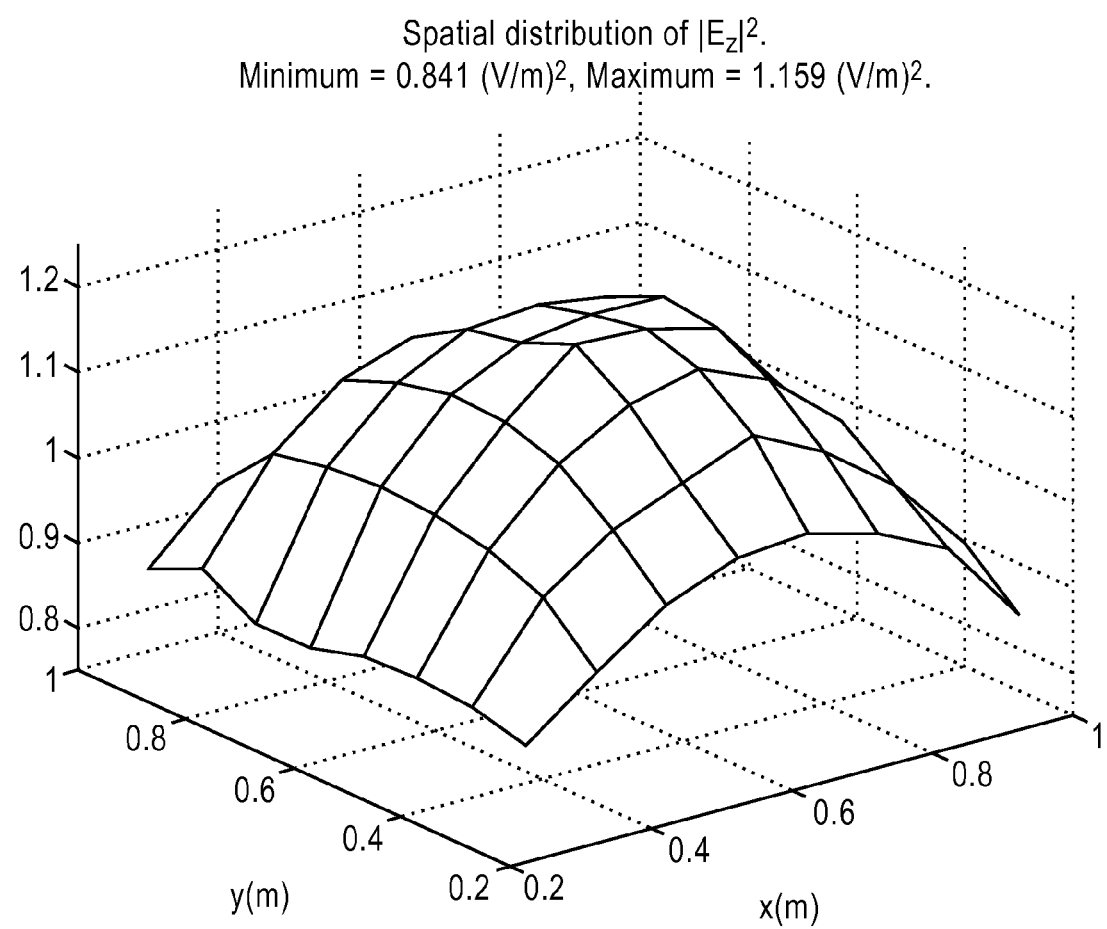

FIGS. 9 and 10 illustrate the best spatial distribution of the magnitude and magnitude squared, respectively, of the electric field component perpendicular to the electrode 710 in the simulated plasma chamber system 700 using generators that are only capable of delivering positive net power. This illustrates the limitations of using traditional generators and feed systems that are designed to deliver power at all of the available feed points as the best distribution is only marginally better than the natural distribution obtained by driving the electrode in the middle with a single generator (±8% variation in electric field magnitude compared to ±12%). Table I shows the net power (in µW) delivered by each one of the nine generators in order to generate the best electric field distribution as shown in FIGS. 9 and 10.

Note that for a given field distribution using N feed points on the electrode 710, a M+N network can achieve the field distribution using only M generators that all deliver positive net power. The extreme case is a 1+N power network with a single generator. Lowering M limits the ability to easily adjust the field distribution by control of the generators and control of the field distribution must then be achieved using variable elements in the M+N port network. For a particular application, a combination of M adjustable generators with variable elements in the network can be used to maintain flexibility.

Figure 13:
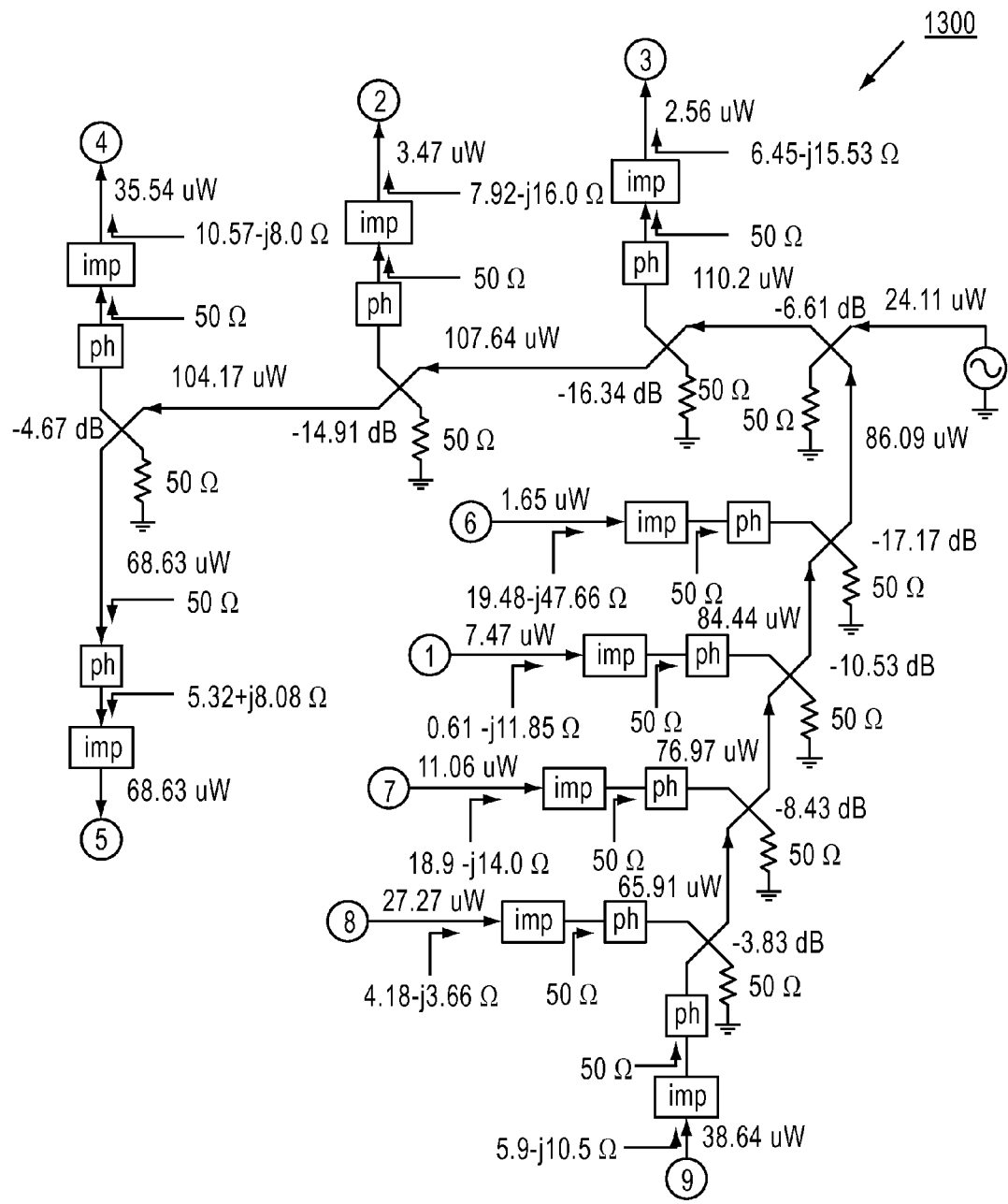
FIG. 13 illustrates an exemplary implementation of a N+1 port network according to an embodiment of the invention.

FIG. 13 illustrates an exemplary implementation of an N+1 port network 1300 corresponding to the solution in Table II, according to an embodiment of the invention. In this circuit, the nine feed points along the electrode 710 are represented by circles with numbers inside as indicated in FIG. 8. Circuit blocks labeled "imp" represent impedance transformers, the identification and implementation of which are apparent to one of ordinary skill in the art, for transforming the impedance between the values shown. Circuit blocks labeled "ph" apply a phase shift in a 50Ω environment, the implementation of which is apparent to one of ordinary skill in the art. Crossing lines indicate 90 degree hybrid couplers with the indicated coupling factors, the implementation of which is apparent to one of ordinary skill in the art. Although many embodiments of the invention are described in connection with a 50Ω environment, this is not necessary and any other convenient reference impedance (or set of reference impedances) may be used.)

In an alternative embodiment of the invention, the impedance transformers and phase shift elements may be combined. Note that under normal operation, no power would be dissipated in the 50Ω resistors, so those resistors make good injection points to perturb the nominal solution with low power generators that can either absorb or deliver small amounts of power. In another embodiment, the resistors may be removed, but doing so increases the sensitivity of the network 1300 to small perturbations.

Figure 14:
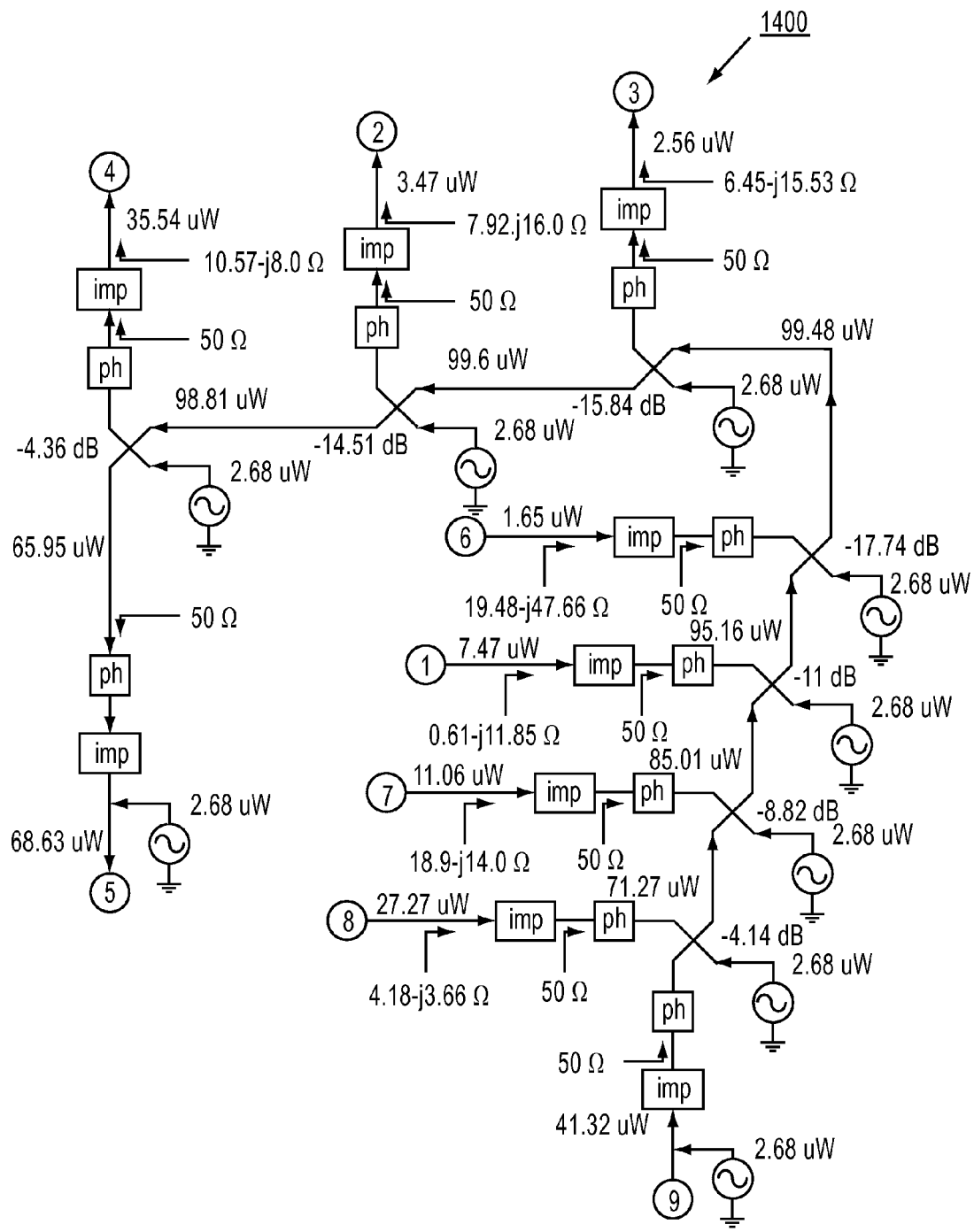
FIG. 14 illustrates an N+N port network that uses equal power from each generator according to an embodiment of the invention.

FIG. 14 illustrates an N+N port network 1400 that uses equal power from each generator according to an embodiment of the invention. For example, each generator that is

TABLE I

| P1 | P2 | P3 | P4 | P5 | P6 | P7 | P8 | P9 |
|---|---|---|---|---|---|---|---|---|
| 0.1809 | 0.2922 | 0.5885 | 11.8464 | 6.2101 | 1.0519 | 0.0007 | 0.0020 | 0.0591 |

Figure 11:
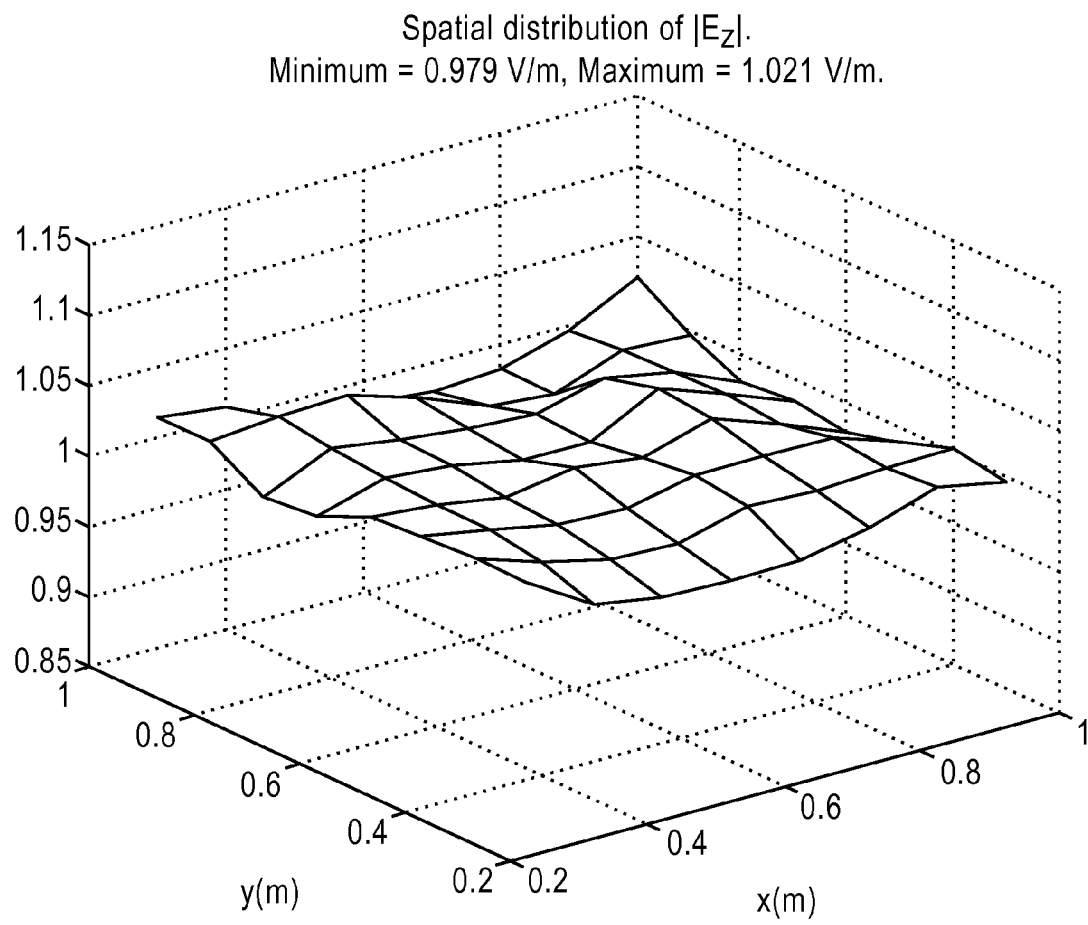
FIGS. 11 and 12 illustrate the best spatial distribution of the magnitude and magnitude squared, respectively, of the electric field component perpendicular to the electrode produced by generators that are capable of delivering and absorbing net power according to an embodiment of the invention.
Figure 12:
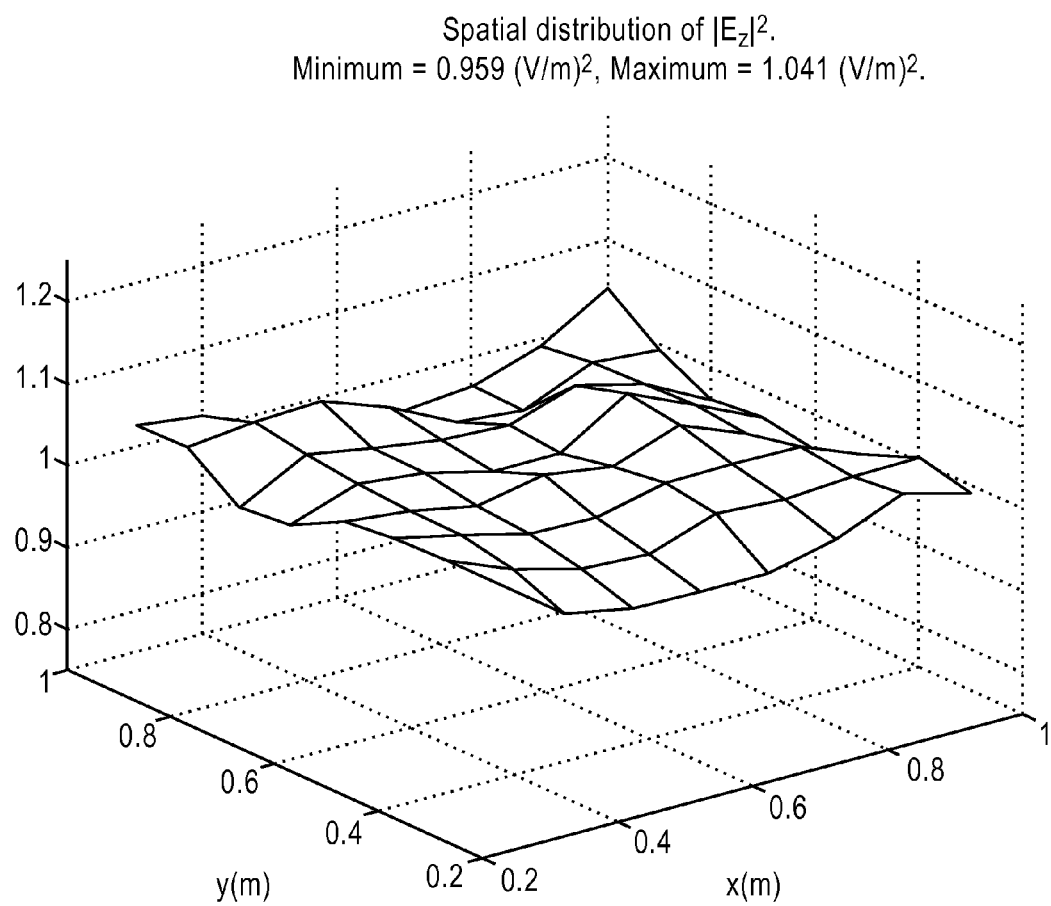

FIGS. 11 and 12 illustrate the best spatial distribution of the magnitude and magnitude squared, respectively, of the electric field component perpendicular to the electrode 710 in the simulated plasma chamber system 700 using a power delivery system capable of delivering and absorbing net power according to an embodiment of the invention. In this simulation, only one field distribution is used. As shown in FIG. 11, the component of the electric field perpendicular to the electrode in the plasma shows a variation of ±2.1% over the surface of the electrode 710. Table II shows the net power (in µW) delivered to each feed point in order to generate the best electric field distribution as shown in FIGS. 11 and 12.

coupled to a respective feed point provides 2.68 µW. This approach permits better control over the electromagnetic field distribution corresponding to the net power values presented in Table II. In other words, the network 1400 permits flexibility to perturb the electromagnetic fields by adjusting the power and/or phase of each generator.

Figure 15:
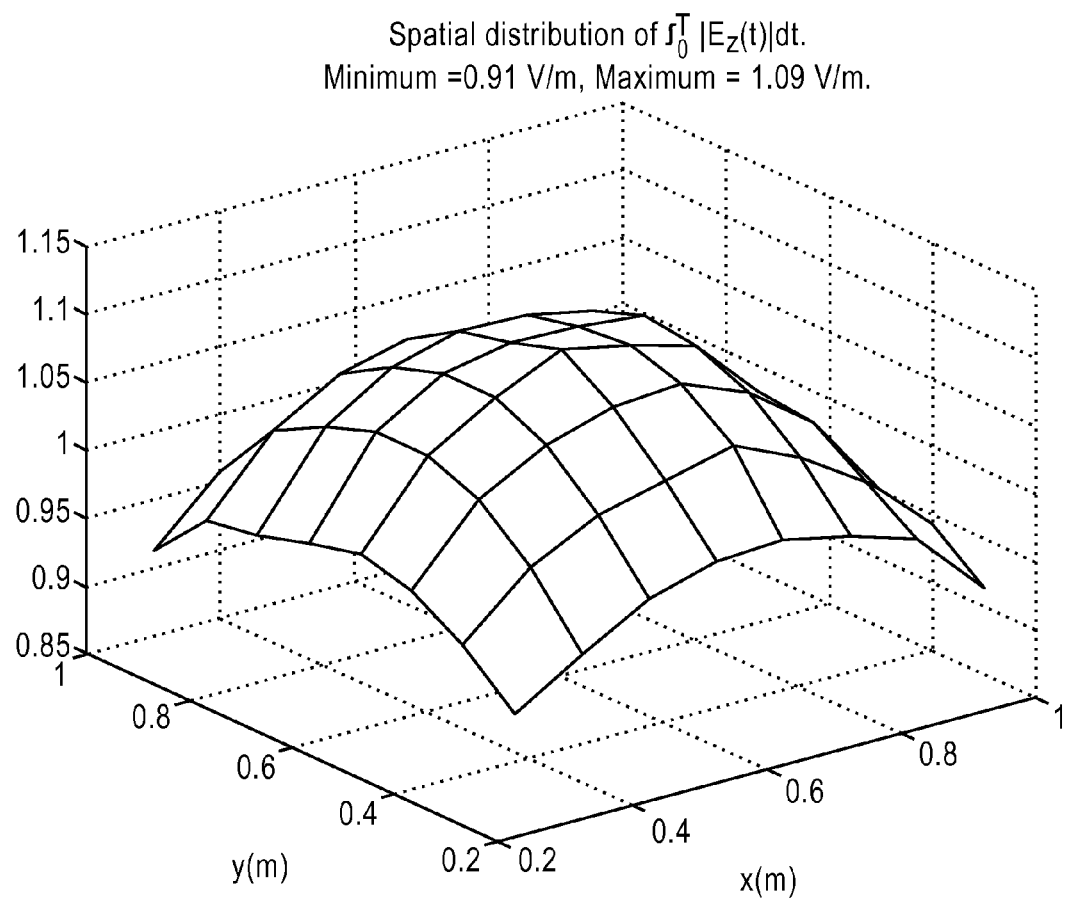
FIGS. 15 and 16 illustrate the best spatial distribution of the time-averaged magnitude and magnitude squared, respectively, of the electric field component perpendicular to the electrode in the simulated plasma chamber system using generators that are only capable of delivering positive net power.
Figure 16:
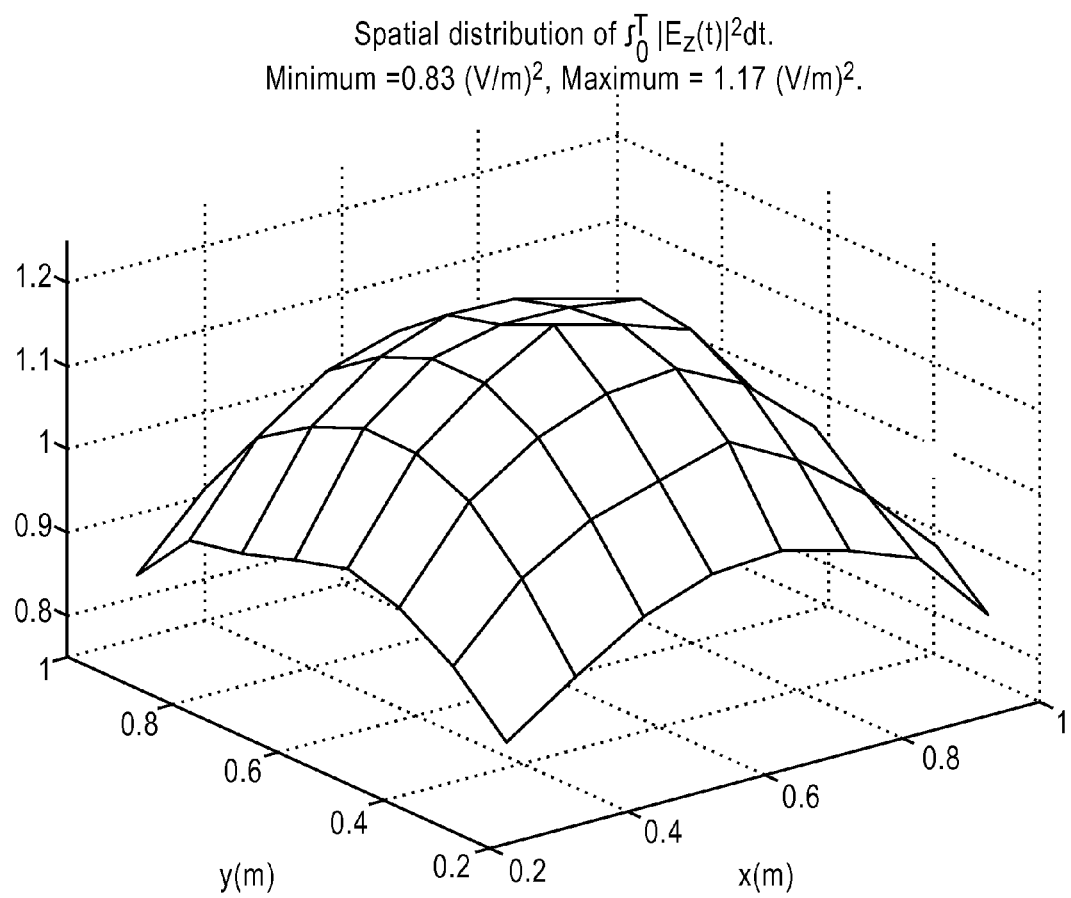

FIGS. 15 and 16 illustrate the best spatial distribution of the time-averaged magnitude and magnitude squared, respectively, of the electric field component perpendicular to the electrode 710 in the simulated plasma chamber system 700 using generators that are only capable of delivering positive

TABLE II

| P1 | P2 | P3 | P4 | P5 | P6 | P7 | P8 | P9 |
|---|---|---|---|---|---|---|---|---|
| −7.4725 | 3.4705 | 2.5576 | 35.5381 | 68.6302 | −1.6508 | −11.0623 | −27.2684 | −38.6417 | net power. In this simulation, nine (9) different field distributions were combined to generate the time-averaged spatial field distributions.

As shown in FIG. 15, the component of the electric field perpendicular to the electrode in the plasma shows a variation of ±9.0% over the surface of the electrode 710 again illustrating the limitation of using a traditional system designed to deliver net power at each feed point. Table III shows the net power (in μW) delivered to each feed point in order to generate the best electric field distribution as shown in FIGS. 15 and 16. In this table, every row corresponds to a different field distribution, where "Time" indicates the normalized time spent in each configuration.

TABLE III

| Time | P1 | P2 | P3 | P4 | P5 | P6 | P7 | P8 | P9 |
|---|---|---|---|---|---|---|---|---|---|
| 0.1240 | 2.3219 | 2.6879 | 0.0526 | 5.8506 | 7.3467 | 0.8440 | 0.4304 | 0.3128 | 0.2875 |
| 0.1253 | 1.8316 | 2.5968 | 0.0838 | 6.5610 | 6.1491 | 0.7959 | 0.7861 | 0.0076 | 0.3185 |
| 0.1241 | 2.2496 | 2.6561 | 0.0612 | 6.1421 | 7.8204 | 0.9620 | 0.7897 | 0.3264 | 0.5836 |
| 0.1259 | 2.0264 | 2.6616 | 0.0475 | 6.4063 | 6.1194 | 0.7788 | 0.4397 | 0.3839 | 0.3221 |
| 0.1240 | 2.3330 | 2.7479 | 0.0580 | 6.2061 | 7.5092 | 0.8672 | 0.5497 | 0.3353 | 0.3509 |
| 0.1258 | 1.8514 | 2.5568 | 0.0859 | 6.3822 | 5.8678 | 0.7956 | 0.5998 | 0.8260 | 0.0046 |
| 0.1242 | 2.2283 | 2.6223 | 0.0817 | 6.1526 | 7.8306 | 0.9757 | 0.8473 | 0.3261 | 0.6204 |
| 0.0634 | 2.0034 | 2.6497 | 0.0854 | 6.6415 | 6.2373 | 0.6882 | 0.2056 | 0.1853 | 0.6654 |
| 0.0633 | 1.8246 | 2.5316 | 0.1228 | 6.7718 | 6.2358 | 0.9654 | 0.2360 | 0.0009 | 0.2344 |

Figure 17:
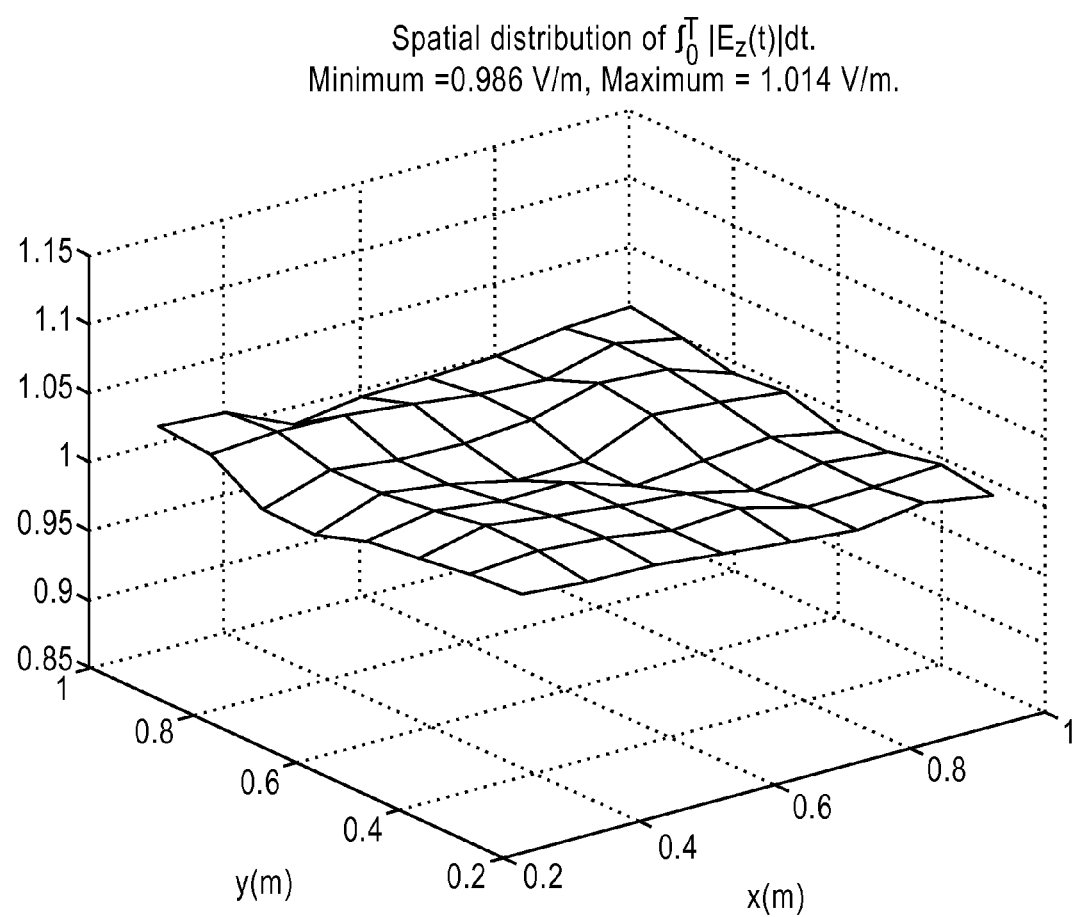
FIGS. 17 and 18 illustrate the best spatial distribution of the time-averaged magnitude and magnitude squared, respectively, of the electric field component perpendicular to the electrode in the simulated plasma chamber system using generators that are capable of delivering and absorbing net power according to an embodiment of the invention.
Figure 18:
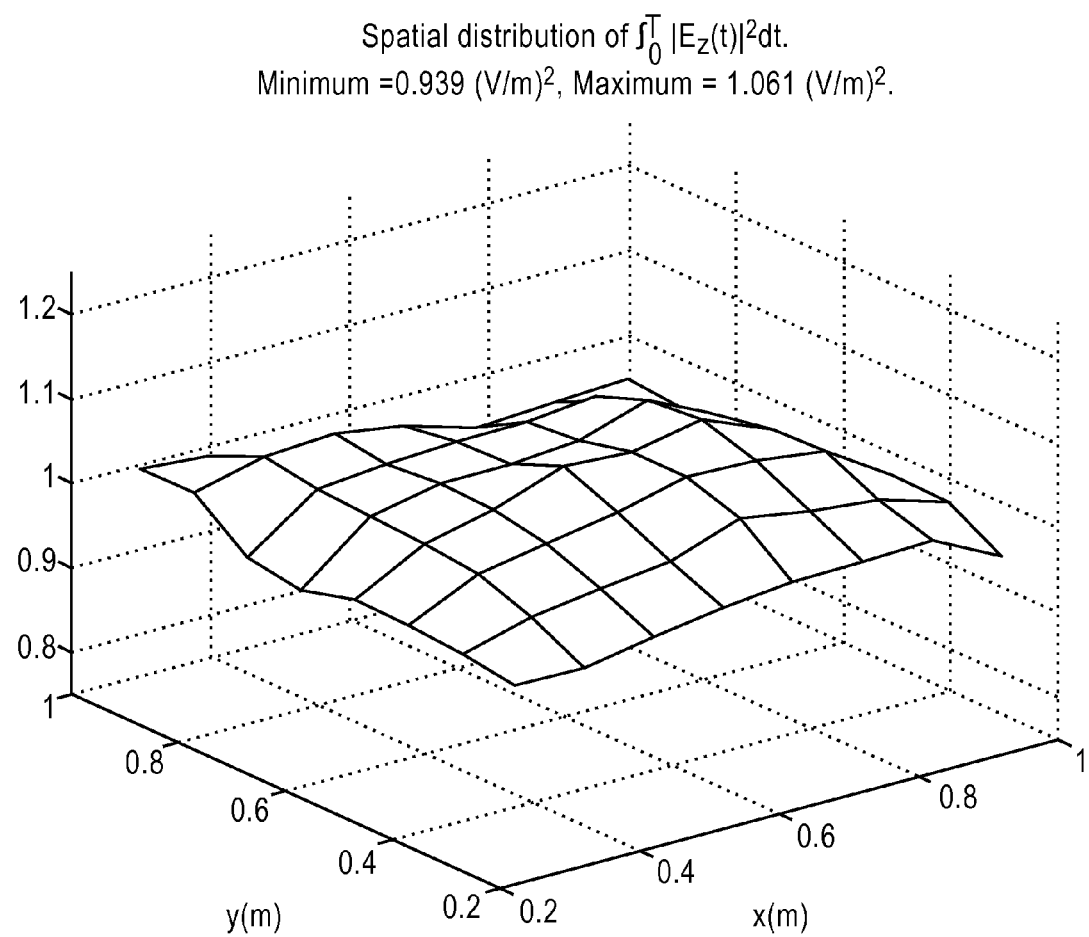

FIGS. 17 and 18 illustrate the best spatial distribution of the time-averaged magnitude and magnitude squared, respectively of the electric field component perpendicular to the electrode 710 in the simulated plasma chamber system 700 using a delivery system capable of delivering and absorbing net power according to an embodiment of the invention. In this simulation, nine (9) different field distributions were combined to generate the time-averaged spatial field distributions. As shown in FIG. 17, the component of the electric field perpendicular to the electrode in the plasma shows a variation of ±1.4% over the surface of the electrode 710. Table IV shows the net power (in μW) delivered to each feed point in order to generate the best electric field distribution as shown in FIGS. 17 and 18. In this table, every row corresponds to a different field distribution, where "Time" indicates the normalized time spent in each configuration.

TABLE IV

| Time | P1 | P2 | P3 | P4 | P5 | P6 | P7 | P8 | P9 |
|---|---|---|---|---|---|---|---|---|---|
| 0.0591 | −8.9297 | 1.5559 | 16.6927 | −10.5302 | 5.4862 | 1.8099 | −32.3071 | −3.9700 | 68.9825 |
| 0.0633 | 2.4437 | 4.5627 | −0.1153 | −15.2384 | 7.7296 | −12.3884 | 27.0795 | 9.2492 | 22.7196 |
| 0.0614 | −13.1231 | 6.1025 | −0.7725 | 13.3367 | 18.8780 | −49.5128 | 33.3621 | 25.0831 | 14.9776 |
| 0.0671 | −12.7538 | 51.8772 | 6.6186 | 24.6471 | 4.8117 | −48.2965 | 34.5092 | −10.9771 | −5.5196 |
| 0.0512 | −4.1476 | −3.1387 | 6.6695 | 21.4214 | 1.8358 | 30.6845 | −5.6308 | 2.8667 | 1.2130 |
| 0.1105 | 3.6785 | 8.9666 | −4.2758 | 10.8120 | −16.7161 | −7.4401 | 16.5631 | 2.4920 | 4.3613 |
| 0.0581 | 2.6779 | 5.3897 | 0.9092 | 4.4227 | 10.8448 | 15.9421 | 2.4433 | −35.2648 | 9.4341 |
| 0.3060 | −13.0245 | 12.0046 | 1.8693 | 24.9478 | 92.2506 | 1.1518 | −21.4525 | −5.2517 | −60.2734 |
| 0.2232 | −5.3817 | 0.0314 | 1.9802 | 29.0619 | −9.0804 | −9.1806 | −5.2698 | 1.9499 | 1.1740 |

As shown, combining different field patterns in time to obtain an even spatial distribution of the electric field magnitude has a much smaller impact on the results than the ability to absorb power at some of the feed points. One potential drawback of using generators capable of absorbing power in a controlled way without using a network to equalize generator delivered power is that a large fraction (typically almost 70%) of the delivered power must be absorbed. Having a generator or system that is capable of converting the absorbed power back to usable DC or AC power can cut the input power requirements in half assuming 80% efficiency of recovering the absorbed power. A simpler solution is to implement a network equalizing the power as illustrated earlier.

In simulation it has also been observed that placing a small driven electrode opposite the main electrode can level the fields with much less required power, but normally such an electrode will interfere with other equipment in a plasma chamber.

The gas distribution, together with the electromagnetic field and the chamber (electrode) geometry, affects the deposition rates in PECVD processes. Many embodiments address only the electromagnetic field distribution, but because the critical issue with large (compared to wavelength) chamber dimensions is uneven electromagnetic field distribution, one of ordinary skill in the art appreciates the usefulness of substantially reducing the electric variation (e.g., from about 12% to 1.25% in PECVD processes). Although embodiments of the present invention has been illustrated and described in the context of a PECVD system, the present invention is applicable to other types of chemical vapor deposition (CVD) systems as well as systems using other plasma enhanced processing methods, such as etching. Moreover, one of ordinary skill in the art readily appreciates that the novel RF power generators described herein are able to generate VHF power and ultra-high frequency power (UHF).

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

We claim:

1. A method of powering an electrode system driving a plasma chamber, the method comprising:
coupling M power generators to N feed points on an electrode system,
absorbing power at K of the N feed points, where 0<K<N, and
delivering power at the other N−K feed points;

controlling an impedance presented to the K feed points and controlling the phase and amplitude of delivered power at the other N−K feed points; and converting the power absorbed at one of the K feed points into power useable by one of the N−K feed points;

wherein the M power generators are coupled to the N feed points on an electrode system via a M+N port network such that the total power delivered to the N feed points is equal to the total power taken from the M generators except for losses in the M+N port network;

wherein the power delivered by each of the M generators are equal.

2. The method of claim 1, including measuring the impedance presented to the K feed points and adjusting variable elements in the M+N port network to adjust the measured impedance to a desired value.

3. The method of claim 2, wherein the M power generators generate power selected from the group of RF power and VHF power.

4. The method of claim 1, including converting the power absorbed at one of the K feed points into power useable by one of the N−K feed points.

5. A method of powering an electrode system driving a plasma chamber, the method comprising:

coupling M power generators to N feed points on an electrode system, absorbing power at K of the N feed points, where 0<K<N, and delivering power at the other N−K feed points wherein at least one of the power generators is capable of absorbing power at least equal to the power delivery capability of the generator.

6. The method of claim 4, including converting the power absorbed at one of the K feed points into power useable by one of the N−K feed points.

7. The power distribution system of claim 5, wherein M is not equal to N.

8. A power distribution system comprising:

a number, M, of generators connected to a number, N, of feed points on an electrode system, the generators comprising a first generator capable of absorbing power from a point on an electrode, and a first impedance matching network coupled to the first generator, the first impedance matching network presenting a controlled impedance to the point on the electrode when the first generator is absorbing power from the point on the electrode;

wherein the first impedance matching network is coupled to all of the M generators and comprises N ports capable of coupling the first impedance matching network to N points on the electrode;

wherein the first impedance matching network delivers power to a first subset of the N points on the electrode and absorbs power from a second subset of the N points on the electrode.

9. A power distribution system comprising:

a number, M, of generators connected to a number, N, of feed points on an electrode system, the generators comprising a first generator capable of absorbing power from a point on an electrode, and a first impedance matching network coupled to the first generator, the first impedance matching network presenting a controlled impedance to the point on the electrode when the first generator is absorbing power from the point on the electrode; and a common bus for recovering power absorbed at one generator and delivering a portion of that absorbed power to another generator.

10. A power distribution system comprising:

a number, M, of generators, and an M+N port network coupled to all of the M generators, and comprising N ports capable of coupling the M+N port network to N points on one or more electrodes, the M+N port network being capable of absorbing power from at least one of the N points on the one or more electrodes wherein the M+N port network transfers absorbed power from one of the N points to another one of the N points delivering power to the one or more electrodes.

11. The power distribution system of claim 10, wherein all of the M generators deliver positive net power to the M+N port network.

12. A power distribution system comprising:

a common driver amplifier, a first amplitude and phase adjustment circuit, a first power amplifier, and a first impedance matching network coupled to the first power amplifier or the first amplitude and phase adjustment circuit, and a feed point on an electrode, the first power amplifier or the first impedance matching network being capable of absorbing power from the feed point on the electrode.

13. The power distribution system of claim 12, further comprising:

a power divider, a second amplitude and phase adjustment circuit, a second power amplifier, and a second impedance matching network coupled to the second power amplifier or the second amplitude and phase adjustment circuit, and a second feed point on an electrode.

14. A method of powering an electrode system driving a plasma chamber, the method comprising:

coupling N−L power generators and L dissipative loads to N feed points on an electrode system with N 2-port impedance matching networks, absorbing power at K of the N feed points, including feedpoints where loads are connected where 0<L K<N, and delivering power at the other N−K feed points.

15. The method of claim 14, including controlling an impedance presented to the K feed points and controlling the phase and amplitude of delivered power at the other N−K feed points.

* * * * *